United States Patent [19]

Izaki et al.

[11] Patent Number: 4,994,849
[45] Date of Patent: Feb. 19, 1991

[54] IMAGING DEVICE

[75] Inventors: Takeshi Izaki; Yousuke Ito; Michitoshi Akao, all of Nagoya, Kenji Sakakibara; Tokunori Katoh, both of Ichinomiya; Hiroshi Morisaki, Nishikasugai, all of Japan

[73] Assignee: Brother Kogyo Kabushiki Kaisha, Aichi, Japan

[21] Appl. No.: 426,884

[22] Filed: Oct. 25, 1989

[30] Foreign Application Priority Data

Oct. 25, 1988 [JP] Japan .................. 63-268833
Jan. 30, 1989 [JP] Japan .................... 1-20411

[51] Int. Cl.⁵ .......................................... G03B 27/32
[52] U.S. Cl. ................................................ 355/27

[58] Field of Search ................ 355/27, 28, 79; 250/231 SR; 318/77, 78; 430/138

[56] References Cited

U.S. PATENT DOCUMENTS 3,934,182  1/1976  Donohue et al. ............... 318/85
4,742,374  5/1988  Yamamoto et al. .............. 355/27
4,809,049  2/1989  Okuzawa et al. ................ 355/28

Primary Examiner—L. T. Hix
Assistant Examiner—Khanh Dang
Attorney, Agent, or Firm—Kane, Dalsimer, Sullivan, Kurucz, Levy, Eisele and Richard

[57] ABSTRACT

An imaging device includes a first motor for feeding one of two sheets and a second motor for feeding the other sheet. The amounts of feeding of the sheets is detected and used to control the motors to maintain a predetermined relationship between the sheets.

11 Claims, 4 Drawing Sheets

IMAGING DEVICE

BACKGROUND OF THE INVENTION

This present invention relates to an imaging device for forming a visible image on a developing sheet based upon a latent image having been previously formed on a surface of a recording sheet in accordance with an image of an original, more particularly to an imaging device utilizing a plurality of driving system for feeding the above sheets.

Conventionally, an imaging device in which an optical image is formed on a photo sensitive recording medium in accordance with specific image information, for example an image on an original, has been known. Most of this type imaging device have been structured in a manner that a light is radiated from a light source to an original, and the light reflected at a surface of the original is focused on the photo sensitive recording medium through a plurality of reflecting mirrors, filters, lenses, and so forth, and then a latent image or a visible image is exposed on the photo sensitive recording medium.

Especially, this type of imaging device mostly employs a lengthwise sheet wound to a roll as the photo sensitive recording medium. In this type of imaging device, a plurality of drive systems for feeding the photo sensitive recording medium have been used.

Especially, a device disclosed in the specification of U.S. Pat. No. 4,742,374, a lengthwise photo and pressure sensitive sheet and a cut sheet type color development sheet are employed as the photo sensitive recording medium. The lengthwise photo and pressure sensitive sheet is driven to be fed through a plurality of drive systems. A latent image corresponding to an image of an original is exposed on an exposure side of the photo and pressure sensitive sheet on which a plurality of microcapsules, each containing a component to change the rupture strength thereof when exposed, are coated and a mechanical strength of the microcapsules coated on a portion corresponding tot he original image is changed by the light. The color development sheet, on which a developer material reactable with an another component included in the microcapsules to develop a visible image is coated, and the photo and pressure sensitive sheet which are synchronously fed are pressurized with each other, and the latent image is transferred to the surface of the color development sheet, thereby forming a desired visible image on the color development sheet.

To form a beautiful visible image using such an imaging device, it is necessary to precisely feed the photo sensitive recording medium using a plurality of drive systems without a partial deviation. Especially, in a device in which feeds the two types of recording sheets, i.e., the photo and pressure sensitive sheet and the color development sheet, it is necessary to minimize a cumulative feeding error being cumulated during a feeding operation by a plurality of drive systems.

However, using a plurality of drive systems, a small speed variation which occurs when or after an operation at each of drive systems provided along a feeding path of the photo sensitive recording medium are gradually cumulated, though a deviation at each of the drive systems is respectively small. Thus, the whole moving error of the recording medium is increased.

Especially, in a device using two types of recording sheets, i.e., photo and pressure sensitive sheet and a color development sheet, a deviation in each drive system necessarily occurs. Thus, when the above cumulative feeding error increases, a good visible image cannot be obtained.

SUMMARY OF THE INVENTION

It is therefore an object of the invention to provide an improved imaging device capable of controlling each of amounts of feeding of a plurality of sheets so as to become similar to each other.

For this purpose, according to this invention, there is provided an imaging device, employing a recording medium including at least two sheets arranged to be superposed with each other, comprising first form means for forming an optical image corresponding to an image of an original on a surface of one of said two sheets, second form means for forming a visible image corresponding to the image formed by said first form means on a surface of the other of said two sheets, said imaging device further comprises:

first feed means including a motor member for feeding the one of said two sheets at least from said first form means to said second form means;

second feed means including another motor member for feeding the other of said two sheets to said second form means; and control means for controlling said first feed means and said second feed means so as to respectively feed said two sheets having a predetermined relationship with each other.

DESCRIPTION OF THE ACCOMPANYING DRAWINGS

Figure 2:
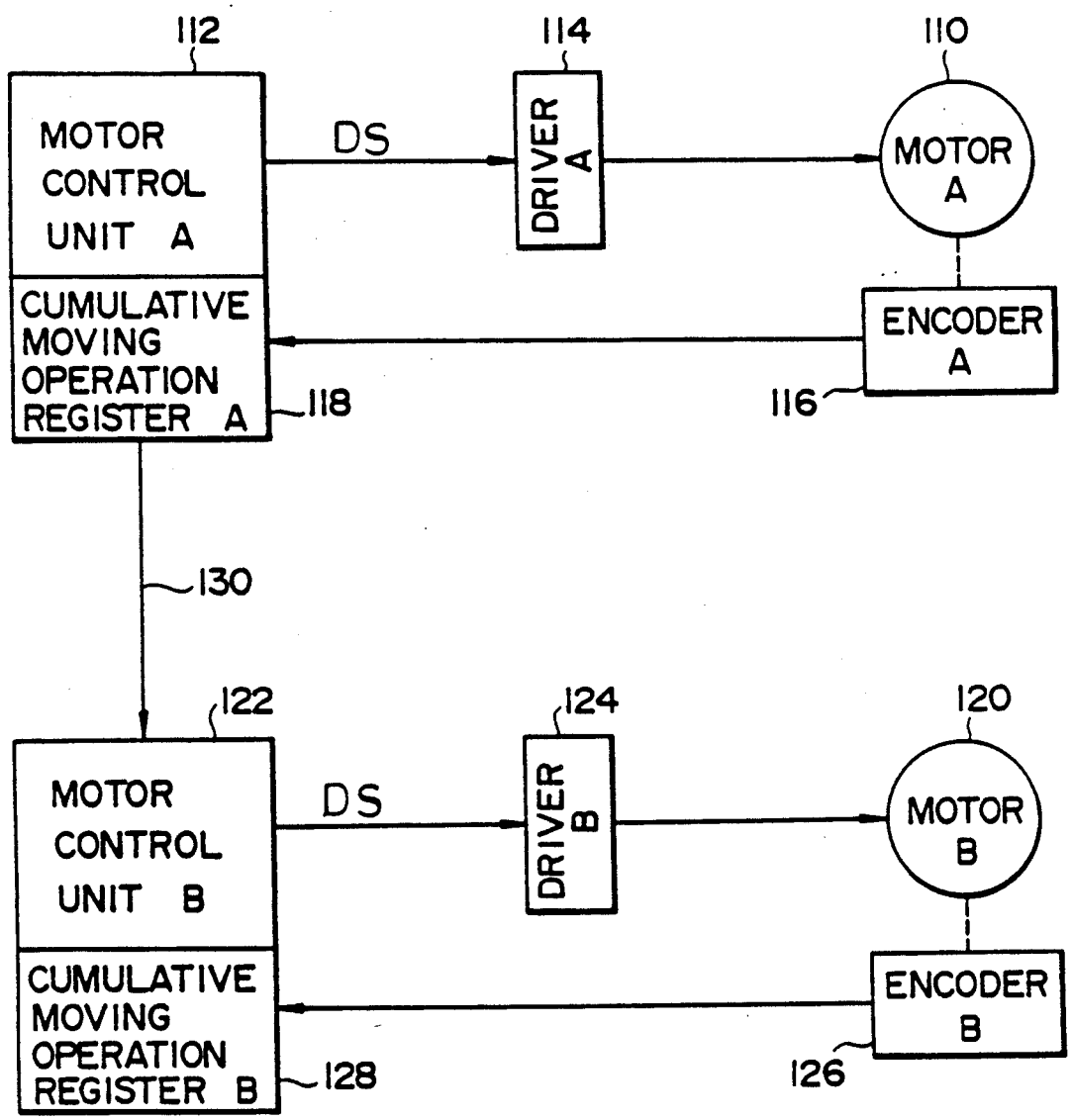
FIG. 2 is a block circuit diagram showing an example of a speed control system for controlling a number of rotations of a plurality of motors utilized for feeding recording sheets.
Figure 3A:
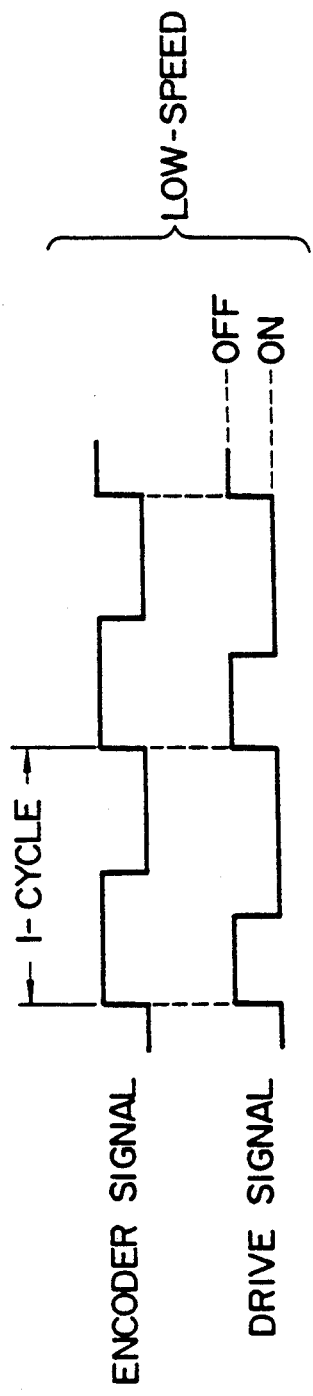
Figure 3B:
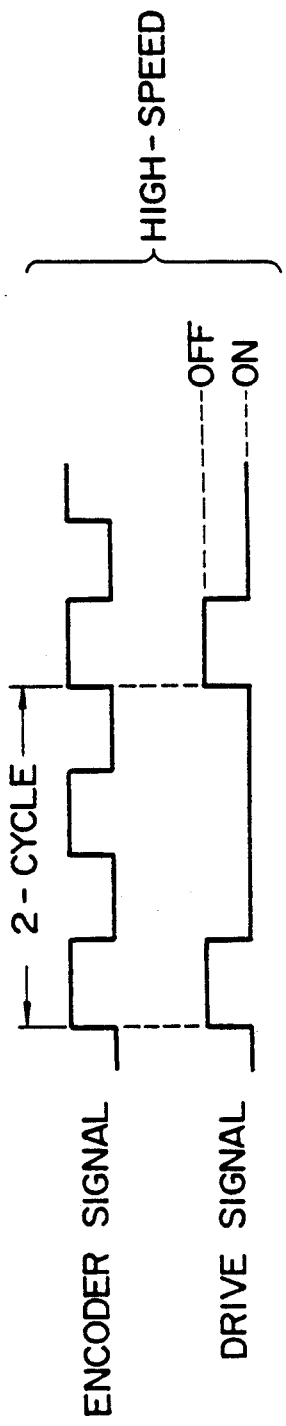
Figure 4:
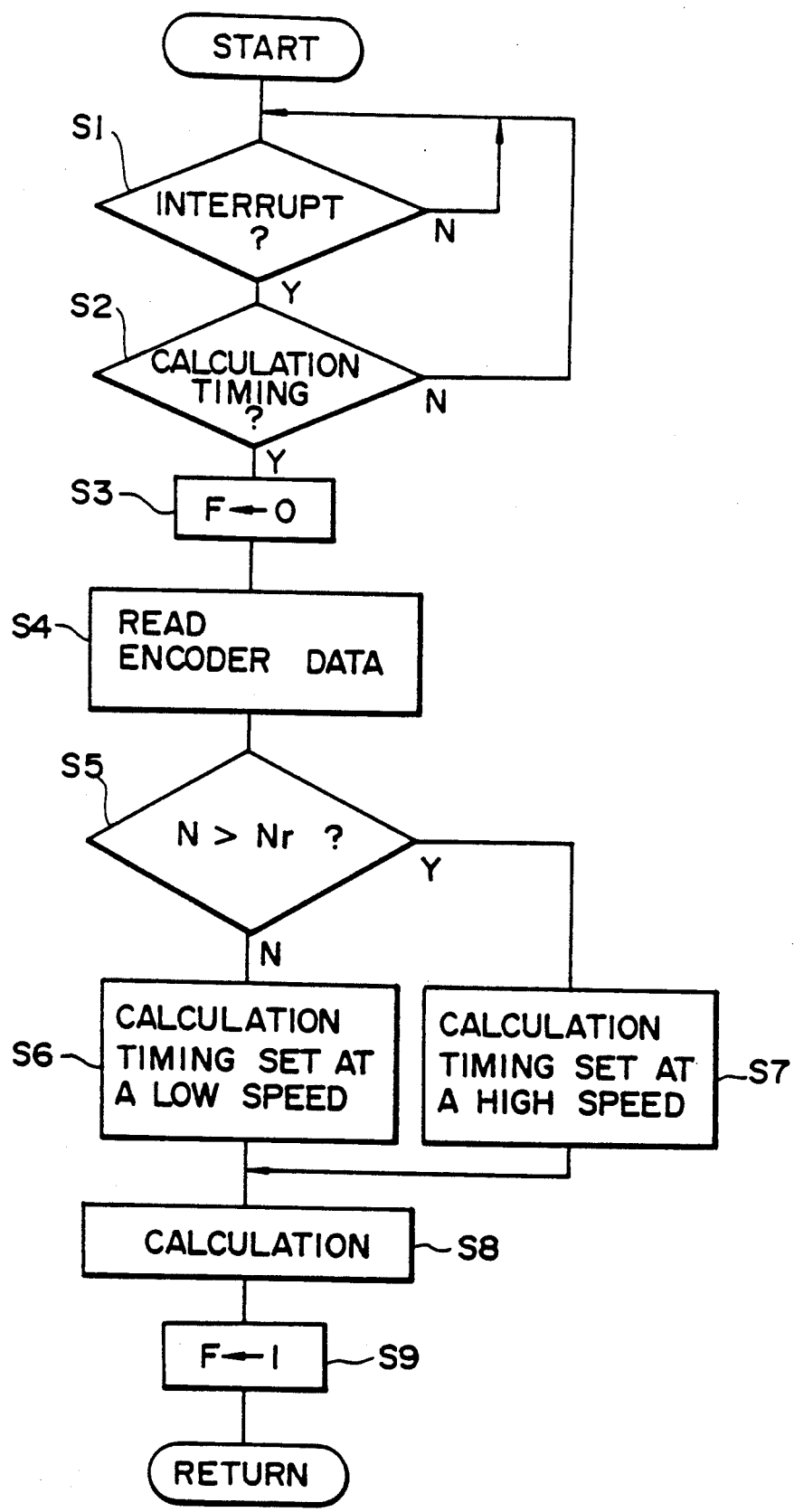

FIGS. 3(A) and 3(B) are a timing chart explaining an operation of the speed control system for a motor of FIG. 2; and FIG. 4 is a flow chart showing an operation of the speed control system of FIG. 2.

DESCRIPTION OF THE EMBODIMENTS

Referring to the drawings, an embodiment of the present invention is described in the following.

Figure 1:
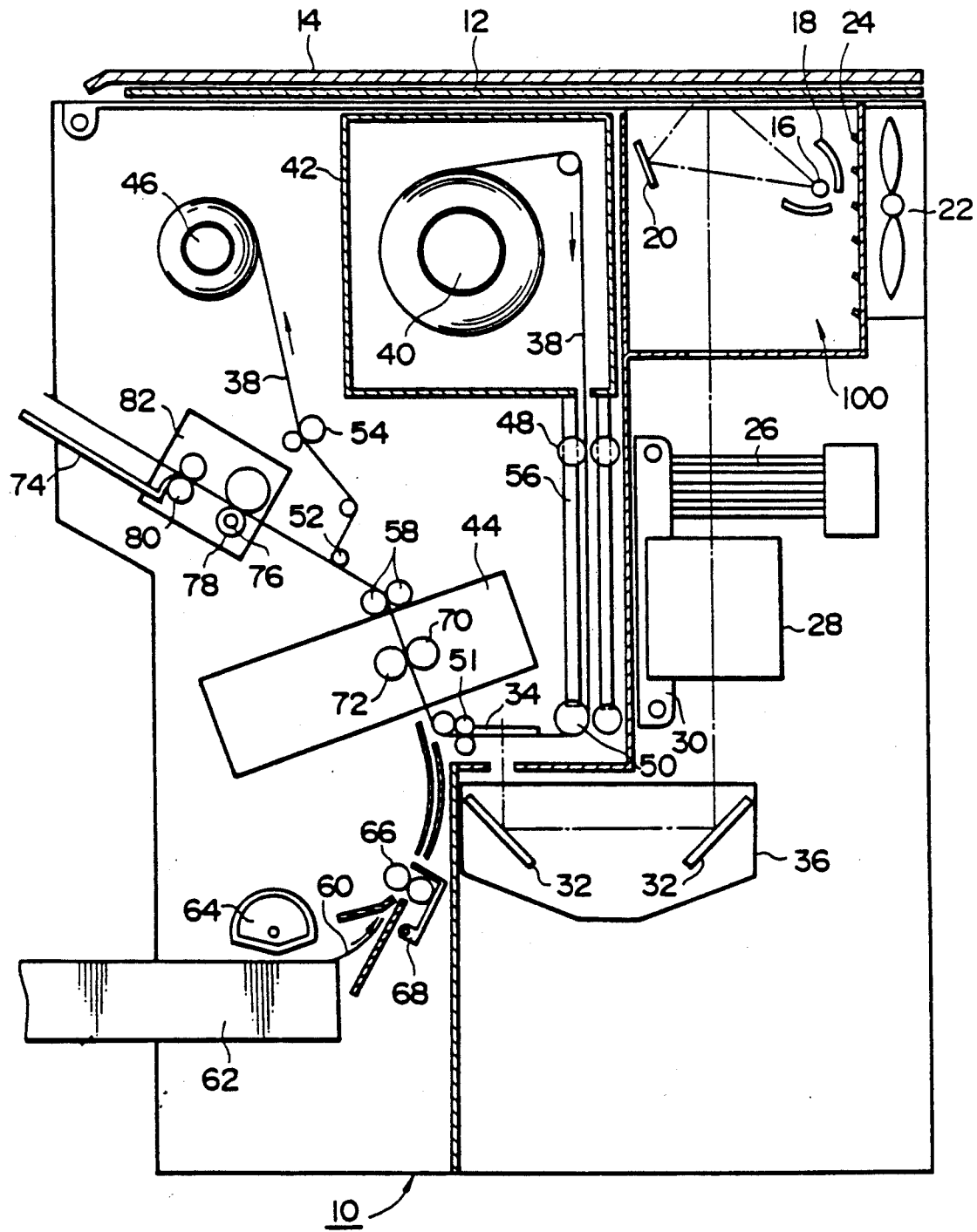
FIG. 1 is an outlined sectional view of the photo and pressure sensitive copying machine as one embodiment of the present invention.

In FIG. 1, as one embodiment of the present invention, an outlined sectional view of a photo and pressure sensitive copying machine is shown. The copying machine of the embodiment is structured so as to make full color copies.

The photo sensitive medium (consisting of a microcapsule sheet and a color development sheet) which can be used for full color copy operations has been disclosed in Japanese Provisional Patent Publication SHO 58-88739 and so forth.

In a photo and pressure sensitive copying machine 10, a top plate comprises an original document table glass 12 movable to the left and right and an original document table cover 14. On the original document table glass 12, a desired original document can be placed in the manner that the document side is on the original document table glass 12.

At the upper right portion of the copying machine 10, a lamp room 100 is disposed. In the lamp room 100, a light source, which consists of a rod type halogen lamp 16 which is extended perpendicular to a moving direction of the original document table glass 12 and a semitubular reflecting mirror 18 which is disposed therearound, is fixed and linearly radiates light to the original document table glass 12.

Thus, the halogen lamp 16 can sequentially radiate the light to the entire surface of the original document table glass 12 from the left end to the right end as the original document table glass 12 moves to the right and left. The light radiated from the light source penetrates the original document table glass 12. After that, the light is reflected on the surface of the original document having been placed on the original document table glass 12. The original document table cover 14 which covers the upper side of the original document table glass 12 is provided so that the radiated light does not leak out from a portion at which the original document is placed.

In addition, to effectively use the light generated by the halogen lamp 16 for radiating the original document, a reflector 20 is disposed on the left side of the light source so that the light which is not radiated directly to the original document can be used for radiating the original document.

In the lamp room 100 in which the halogen lamp 16 is disposed, the temperature therein rises due to the heat from the halogen lamp 16.

Thus, on the right side of the lamp room 100, a fan 22 and a louver 24 which take in air from the outside are provided. They allow air to be effectively blew to the original document table glass 12, thereby cooling the original document table glass 12 on which the light is radiated by the light from the halogen lamp 16 as well as the inside of the lamp room 100.

The light which is generated by the halogen lamp 16 and reflected by the original document on the original document table glass 12 penetrates a lens 28 through a filter 26. The filter 26 varies the light penetration characteristic depending on the sensitivity characteristic of a micro-capsule sheet 38 and adjusts the color tone of a copying image. The lens 28, mounted on a lens mounting plate 30, is arranged to be finely adjusted for an optical path of the penetrating light.

The light which is collected by the lens 28 is deflected for 180 degrees by two reflecting mirrors 32, 32 and then focused on the micro-capsule sheet 38 which is in contact with the lower side of an exposure table 34. The two reflecting mirrors 32, 32 are fixed to a mirror mounting table 36. The length of the optical path and the focal point are adjusted by precisely adjusting the mounting plate of the mirror mounting table 36.

On the other hand, the roll type micro-capsule sheet 38 is wound to a cartridge shaft 40, housed in a cartridge 42 which is detachable, and disposed beneath the original document table glass 12. One end of the micro-capsule sheet 38 is wound to a take-up shaft 46 through a plurality of rollers and a pressure development unit 44.

In other words, the micro-capsule sheet 38 which passes through the lower portion of the cartridge 42 is fed to the pressure development unit 44 through the lower portion of the exposure table 34 with guidance of feed rollers 48, a drum roller 50, and rollers 51. After that, the micro-capsule sheet 38 which passes through he pressure development unit 44 is wound to the take-up shaft 46 with guidance of a separation roller 52 and a skew adjustment roller 54. The micro-capsule sheet 38 which is fed from the cartridge 42 and which has not been exposed is kept in non-exposure state by a light insulation cover 56.

The feed speed of the micro-capsule sheet 38 is usually controlled so that it becomes constant by a capsule sheet feed rollers 58. In addition, the feed speed accords with the moving speed of the original document table glass 12. Thus, when the micro-capsule sheet 38 passes through the exposure table 34, each latent image of a specific line of the original document is sequentially formed.

Beneath the pressure development unit 44, a color development sheet cassette 62 which houses a plurality of cut sheet type color development sheets 60 is provided. The color development sheets 60 are fed sheet by sheet by a semicircular roller 64 and the top end thereof is positioned by a color development sheet rollers 66 and a resist gate 68. After that, the color development sheet 60 is fed to the entrance of the pressure development unit 44.

Thus, the micro-capsule sheet 38 and the color development sheet 60 which is in contact therewith are supplied tot he pressure development unit 44.

The pressure development unit 44 includes a pair of pressure rollers 70, 72. The micro-capsule side of the micro-capsule paper 38 on which a latent image corresponding to the image of the original has been formed is contacted with the color development agent side of the color development sheet 60, nipped between the pressure rollers 70, 72 and then pressurized therewith, so that micro-capsules which have not been exposed are broken and a visible image corresponding to the original image is formed, by a reaction of the development agent with a component having been included in the microcapsules, on the color development sheet 60.

The micro-capsule sheet 38 and the color development sheet 60 which exit from the pressure development unit 44 are fed by the capsule sheet feed rollers 58. After that, the micro-capsule sheet 38 is upwardly fed and the color development sheet 60 is fed perpendicular thereto by the separation roller 52. After the color development sheet 38 is color-developed by a heat fixing device 82, the formed visible image is finally fixed on the surface of the color development sheet 60. After that, the color development sheet 60 is fed out to a sheet eject tray 74 in such a manner that the visible image is on the top side. The heat fixing device 82 consists of a hollow heat roller 78 having a heater 76 therein and color development sheet feed rollers 80.

The separated micro-capsule sheet 38 being separated is wound to the take-up shaft 46 through the skew adjustment roller 54.

To make a copy using the above photo and pressure sensitive copying machine 10, the following operations are required. First, open the original document table cover 14, place the original document on the original document table glass 12, set the number of copies using a panel switch, not shown, and then press a start switch, not shown, With these operations, the copying machine 10 sequentially copies the original document to the color development sheets for the number of sheets being set and ejects them to the sheet eject tray 74.

In other words, in the copying machine 10 according to the present embodiment, when the start switch is depressed, the original document table glass 12 is moved to the right, in FIG. 1, and the left end of the original document table glass 12 is stopped at a position opposed to the light source.

After that, when the halogen lamp 16 lights, the original document table glass 12 is moved to the left. The light radiated from the halogen lamp 16 is reflected by the original document, passed through the filter 26, the lens 28, further reflected by the two reflecting mirrors 32, 32, and then focused on the micro-capsule sheet 38 beneath the exposure table 34. At the time, the micro-capsule sheet 38 is moved leftward beneath the exposure table 34 at the same speed as the moving speed of the original document table glass 12, whereby a visible image of the original document is formed on the micro-capsule paper 38 as a latent image.

As the original document table glass 12 is leftward moved, the color development sheet 60 is fed from the color development sheet cassette 62 by the semicircular roller 64. AFter that, the color development sheet 60 is contacted with the micro-capsule sheet 38 which has been exposed and they are supplied tot he pressure development unit 44 wherein the latent image on the micro-capsule sheet 38 is developed and transferred to the color development sheet 60.

After that, the color development sheet 60 is heat fixed by the heat fixing device 82 and then ejected to the tray 74 provided outside the copying machine 10. On the other hand, the micro-capsule sheet 38 which passes through the pressure the development unit 44 is sequentially wound to the take-up shaft 46. After the right end of the original document table glass 12 has moved to the position opposed to the light source, the copy operation is completed and the halogen lamp 15 puts out.

The copying machine 10 of the present embodiment sequentially performs the copy operation for the number of required times.

In the photo and pressure sensitive copying machine 10 which uses two types of recording sheets, namely, the continuous-form micro-capsule sheet 38 and the cut sheet type color development sheet 60, they are often driven by a plurality of independent drive systems.

A feature of the present invention is to control the moving speed, for feeding the sheets, of each of drive systems and to compensate a deviation of the moving amount of the sheets so that the cumulative moving amount of one drive system always accords with that of the other drive system when the recording sheets are fed by a plurality of drive systems.

In such a structure, a good visible image can be always formed on the recording medium. Especially, when the two types of recording sheets consisting of the continuous-form microcapsules sheet 38 and the cut sheet type color development sheet 60 are used like the present embodiment, a good visible image can be formed on the color development sheet 60.

FIG. 2 shows a control circuit of each drive systems of the photo and pressure sensitive copying machine of the present embodiment wherein the device of the present invention comprises a first motor A 110 structuring a first drive system and a second motor 120 B structuring a second drive system.

The first motor A 110 slidably drives the original document table glass 12 and drives the roller group comprising the rollers 48, 50, and 51 to be respectively rotated as a first drive system. The second motor 120 B drives the roller group comprising the rollers 72, 54, 46, 78, and 80 to be respectively rotated as the second drive system.

The device of the present embodiment is provided with a first motor control device A 112 which computes and outputs a motor control signal DS, a first driver A 114 which rotates and drives the motor 110 A according to the control signal, a first encoder A 116 which converts the rotation of the motor 110 A into a pulse train, and a first cumulative operation amount register A 118 which counts the pulse train of the encoder A 116 and computes the cumulative moving amount of the recording sheet from the rotation of the motor A 110.

The first motor control device A 112 resets the first cumulative operation amount register A 118 and computes and outputs the control signal DS, of the first motor A 110 to the driver A 114 when the start button, not shown, is turned on.

The apparatus of the present invention is also equipped with as a second control system which controls a second motor B 120, a second motor control device 122 B which computes and outputs a control signal DS to a second motor B 120, a second driver B 124 which rotates and drives the second motor B 120 according to the second driver B 124, and a second encoder B 126 which converts the rotation of the motor 120 B into a pulse train, and a second cumulative operation amount register B 128 which stores the cumulative moving amount of the second recording sheet.

The second motor control device B 122 resets the second cumulative operation amount register B 128 and cumulates and outputs the control signal DS of the second motor B 120 to the second driver B 124 when the start button (not shown) is turned on.

The first motor control device 112 A is electrically connected to the second motor control device B 122 through a transmission line 130, the first motor control device A 112 transmitting the motor control speed and the cumulative moving amount of the first drive system tot he second motor control device B 122 through a transmission line 130.

The second motor control device B 122 to which data are sent through the transmission line 130 computes the data and controls the second motor B 120 so that it is driven to be rotated at the same speed as the first motor A 110. The second motor control device B 122 also feedback-controls the moving speed of the second motor B 120 against the first motor A 110 so that the cumulative moving amount sent through the transmission line 130 accords with that stored in the second cumulative operation amount register B 128.

In this structure, the first motor A 110 and the second motor B 120 operate in the manner that they move individual recording medium at the same feed speed and that the cumulative moving amount of the moving medium by the motor A 110 always accords with that by the motor B 120.

With respect to a speed control system used in the above control operation, it may be considered that the control devices are respectively arranged to skip specific number of leading edges of the encoder signal, i.e., pulses, when the period of the leading edge of each cycle of an encoder signal becomes short, i.e., the motor is driven to be rotated at a high speed, as shown in FIG. 3(A) and (B). The motor control device executes an interrupt at a leading edge of every predetermined cycles, and outputs to the drive circuit the drive signal. Thus, even if the motor rotates at a high speed, the ON time on which the drive signal DS is outputted is maintained, whereby the motor speed can be controlled at a high speed.

As shown in FIG. 3(A), while a motor whose speed is at a low speed, whenever one cycle of an encoder signal is started, the computer program of the control device is interrupted. When the interrupt takes place, the control device starts a computation of the drive signal DS for predetermined period of time, for example, approximately 0.1 msec. After the computation, it outputs a drive signal DS so as to control the rotation of the motor.

When the motor is driven to be rotated at a high speed, as shown in FIG. 3(B), the control device starts the computation at the leading edge of every two cycles of the encoder signal, and then outputs the drive signal DS to the driver. In other word, the control device skips the second leading edge of two cycles of the encoder signal and starts the computation at the leading edge of the first cycle thereof. In this manner, the time on which the drive signal DS is outputted, namely, the duty ratio of the ON time of the drive signal increases, so that the rotation of the motor can be controlled even when the motor rotates at a high speed.

In the embodiment shown in FIG. 3(B), at the leading edge of every two cycles of the encoder signal, the control device is interrupted so as to compute the drive signal. However, when the motor is driven to be rotated at a much higher speed, the ON time of the drive signal DS is maintained at the leading edge of every three cycles or four cycles.

Referring to a flowchart shown in FIG. 4, the operation of the control device is described in the following.

By receiving the start signal, the control device starts the operation and determines whether any interrupt signal has occurred in the drive control process (step S1). If any interrupt signal has occurred, it is examined whether the interrupt signal relates to a computation timing, namely a specific start signal of the encoder signal or not (step 2). If the signal relates to the computation timing, the control device resets a flag F(step S3) and reads the current rotation N of the motor (step S4). After that, the it is examined whether the current rotation N is higher than a predetermined value Nr (step 5). When the rotation is a high speed, the control device sets a high speed computation timing, for example, that at the leading edge of every two cycles of the encoder signal. When the rotation is a low speed, the control device sets a low speed computation timing, for example, that at the leading edge of every one cycle of the encoder signal (steps S6 and S7). According to the setting value, the control device executes the computation (step S8), sets the computation timing flag F (step S9), and repeats the operation.

Thus, according to the present embodiment, the micro-capsule sheet and the color development sheet are synchronously and precisely fed by the motors without a displacement of the positions, whereby a latent image formed on the micro-capsule sheet is securely positioned on a specific position on the color development sheet and a visible image is precisely formed on the color development sheet.

What is claimed is:

1. An imaging device, employing a recording medium including at least two sheets arranged to be superposed with each other, comprising first form means for forming an optical image corresponding to an image of an original on a surface of one of said two sheets; second form means for forming a visible image corresponding to the image formed by said first form means on a surface of the other of said two sheets, said imaging device further comprises:

first feed means including a motor member for feeding the one of said two sheets at least from said first form means to said second form means;
   second feed means including another motor member for feeding the other of said two sheets to said second form means; and
   control means for detecting respective amounts of feeding of said two sheets and controlling said first feed means and said second feed means based on the detected amounts of feeding of said two sheets so as to respectively feed said two sheets to maintain a predetermined relationship with each other.

2. The imaging device according to claim 1 wherein said predetermined relationship is that both of said two sheets are fed at a predetermined speed.

3. The imaging device according to claim 1 wherein the one or said two sheets comprises a continuous-form recording sheet coated with a plurality of photo and pressure sensitive microcapsules each containing dye precursor, and wherein the other of said two sheets comprises a cut-form developing sheet, to be superposed with said recording sheet, coated with a developer material being reactable with the dye precursor.

4. The imaging device according to claim 3 wherein said second form means comprises a pair of pressure rollers, adapted to be brought into and out of contact with each other, for pressurizing the recording sheet and the developing sheet in a superposed state to develop a visible image corresponding to the image formed on the surface of said recording sheet by said first form means.

5. The imaging device according to claim 1 wherein said predetermined relationship is that the amounts of feeding of said two sheets are similar to each other.

6. The imaging device according to claim 5 wherein said control means comprises count members for respectively counting the amounts of feeding of said two sheets, and adjust members for respectively adjusting the feeding speed of said two sheets in accordance with results of counting operations executed by said count members so that the results of said count members become similar to each other.

7. The imaging device according to claim 6 wherein each of said count members respectively includes a pair of an encoder member for coding a number of rotations of the motor members into pulses and a register member for cumulatively counting the pulses and storing the numerical data corresponding to the counted pulses, and wherein said adjust members respectively adjusts a number of rotations of the motor members per predetermined period of time in accordance with the data stored in said register members.

8. The imaging device according to claim 7 which further comprises examine means for respectively examining whether a number of rotations of each of the motor members is larger than a predetermined value, and said adjust members respectively adjusts the number of rotations of said motor members by a predetermined number of said pulses in case that it is determined by said examine means that the number of rotations is larger than said predetermined value.

9. The imaging device according to claim 8 wherein said predetermined number of said pulses is 2.

10. The imaging devices according to claim 7 which further comprises reset means for resetting the numerical data stored in said register members.

11. An imaging device, employing a continuous-form recording sheet coated with a plurality of photo and pressure sensitive microcapsules each containing dye precursor, and a cut-form developing sheet, to be superposed with said recording sheet, coated with a developer material being reactable with the dye precursor, comprising expose means for exposing a latent image corresponding to an image of an original on said recording sheet, development means including a pair of pressure-developing rollers adapted to be brought into and out of contact with each other for developing a visible image corresponding to the latent image on said developing sheet, said imaging device further comprises:

first feed means including a motor member for feeding said recording sheets at lest from said expose means to said development means;

second feed means including an another motor member for feeding said developing sheet to said development means;

first count means for cumulatively counting an amount of feeding of said recording sheet executed by said first feed means;

second count means for cumulatively counting an amount of feeding of said developing sheet executed by said second feed means; and storage means for storing results of the counting operations executed by said first count means and said second count means; and control means for controlling said first feed means and said second feed means so as to respectively feed said sheets based upon the results stored in said storage means in such a manner that the amount of feeding of said recording sheet and the amount of feeding of said developing sheet become similar to each other.

* * * * *